United States Patent
Park et al.

(10) Patent No.: US 11,937,378 B2
(45) Date of Patent: Mar. 19, 2024

(54) METHOD OF MANUFACTURING PRINTED CIRCUIT BOARD AND RESIST LAMINATE FOR THE SAME

(71) Applicant: SAMSUNG ELECTRO-MECHANICS CO., LTD., Suwon-si (KR)

(72) Inventors: Chan Jin Park, Suwon-si (KR); Hyun Seok Yang, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/691,785

(22) Filed: Mar. 10, 2022

(65) Prior Publication Data
US 2023/0086970 A1    Mar. 23, 2023

(30) Foreign Application Priority Data
Sep. 23, 2021   (KR) .......................... 10-2021-0125824

(51) Int. Cl.
| | |
|---|---|
| *H05K 3/06* | (2006.01) |
| *C25D 3/38* | (2006.01) |
| *C25D 5/02* | (2006.01) |
| *C25D 5/48* | (2006.01) |
| *C25D 7/00* | (2006.01) |
| *G03F 7/00* | (2006.01) |
| *G03F 7/16* | (2006.01) |

(52) U.S. Cl.
CPC .............. *H05K 3/064* (2013.01); *C25D 3/38* (2013.01); *C25D 5/022* (2013.01); *C25D 5/48* (2013.01); *C25D 7/00* (2013.01); *G03F 7/0035* (2013.01); *G03F 7/164* (2013.01); *H05K 3/062* (2013.01)

(58) Field of Classification Search
None
See application file for complete search history.

(56) References Cited

U.S. PATENT DOCUMENTS

| | | | | |
|---|---|---|---|---|
| 5,202,222 A | * | 4/1993 | Harris | ................. H01L 21/4828 430/311 |
| 2002/0015909 A1 | * | 2/2002 | Mizutani | ................. G03F 7/091 430/338 |
| 2002/0043466 A1 | * | 4/2002 | Dordi | ...................... C23C 18/31 205/186 |
| 2004/0221448 A1 | * | 11/2004 | Naito | ..................... H05K 3/108 29/829 |
| 2006/0204650 A1 | * | 9/2006 | Hu | ........................ C23C 28/021 427/256 |

(Continued)

FOREIGN PATENT DOCUMENTS

JP    2016-072444 A    5/2016

*Primary Examiner* — Louis J Rufo
(74) *Attorney, Agent, or Firm* — Morgan, Lewis & Bockius LLP

(57) ABSTRACT

A method of manufacturing a printed circuit board a includes preparing an insulating substrate on which a first metal layer is formed, stacking a resist laminate having a plurality of layers on the first metal layer, forming an opening exposing a portion of the first metal layer by patterning the stacked resist laminate having the plurality of layers, forming a second metal layer on the exposed portion of the first metal layer, removing the patterned resist laminate having the plurality of layers, and etching at least another portion of the first metal layer.

11 Claims, 6 Drawing Sheets

(56) References Cited

U.S. PATENT DOCUMENTS

| | | | | |
|---|---|---|---|---|
| 2012/0211370 A1* | 8/2012 | Nakai | ................. | H01L 21/4846 |
| | | | | 205/122 |
| 2015/0126029 A1* | 5/2015 | Kimura | ................... | G03F 7/038 |
| | | | | 438/763 |
| 2020/0370184 A1* | 11/2020 | Wu | ................... | H01L 23/49827 |
| 2020/0411317 A1* | 12/2020 | Ecton | ................. | H01L 21/4846 |
| 2021/0341835 A1* | 11/2021 | Theis | ................... | G03F 7/0041 |

* cited by examiner

METHOD OF MANUFACTURING PRINTED CIRCUIT BOARD AND RESIST LAMINATE FOR THE SAME

CROSS-REFERENCE TO RELATED APPLICATION(S)

This application claims benefit under 35 USC 119(a) of Korean Patent Application No. 10-2021-0125824 filed on Sep. 23, 2021 in the Korean Intellectual Property Office, the entire disclosure of which is incorporated herein by reference for all purposes.

TECHNICAL FIELD

The present disclosure relates to a method of manufacturing a printed circuit board and a resist laminate used therefor.

BACKGROUND

In accordance with the miniaturization and weight reduction of electronic devices, high-density printed circuit boards are required, and accordingly, the development of microcircuits having a line/space of about 5/5 μm or less is required. As a method of forming the microcircuit, Semi-Additive Process (SAP), Modified SAP (MSAP) or the like may be used. The SAP or MSAP process uses Dry Resist Film (DFR) for patterning. In this case, a foot may occur on the lower part of the DFR during the developing process of DFR. In this case, when plating is performed, a plating layer may be formed to have an inverted trapezoidal shape in which the width of the lower part is narrower than that of the upper part. Accordingly, an undercut may occur during an etching process for removing chemical copper. Also, in this case, the risk of pattern delamination in which the formed circuit is peeled may be high.

SUMMARY

This summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide a method of manufacturing a printed circuit board, in which undercut may be reduced, and a resist laminate used therefor.

An aspect of the present disclosure is to provide a method of manufacturing a printed circuit board, in which pattern delamination may be reduced, and a resist laminate used therefor.

According to an aspect of the present disclosure, a resist laminate having a plurality of layers is formed by multi-laminating, and the resist laminate having the plurality of layers is patterned by multi-patterning using a selective development process or the like.

According to an aspect of the present disclosure, a method of manufacturing a printed circuit board includes preparing an insulating substrate on which a first metal layer is formed; stacking a resist laminate having a plurality of layers on the first metal layer; forming an opening exposing a portion of the first metal layer by patterning the stacked resist laminate having the plurality of layers; forming a second metal layer on the exposed portion of the first metal layer; removing the patterned resist laminate having the plurality of layers; and etching at least another portion of the first metal layer.

According to an aspect of the present disclosure, a resist laminate includes a first resist layer of non-photosensitivity including an acrylic resin; and a photosensitive second resist layer disposed on the first resist layer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
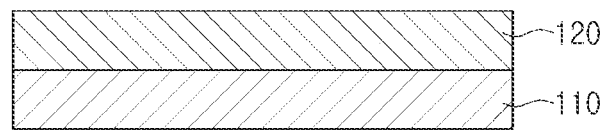
FIG. 1 is a cross-sectional view schematically illustrating a resist laminate according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed, as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

The drawings may not be to scale, and the relative sizes, proportions, and depiction of elements in the drawings may be exaggerated for clarity, illustration, and convenience.

FIG. 1 is a cross-sectional view schematically illustrating a resist laminate according to an example.

Referring to FIG. 1, a resist laminate 100 according to an example includes a first resist layer 110, and a second resist layer 120 laminated on the first resist layer 110. The resist laminate 100 includes a plurality of resist layers as described above, and may include a greater number of resist layers than illustrated in the drawings, if necessary.

The first resist layer 110 may be a non-photosensitive resist layer. For example, the first resist layer 110 may include a non-photosensitive resin. The non-photosensitive resin may be, for example, an acrylic resin, but is not limited thereto. In this case, the acrylic resin refers to a polymer from an ester such as acrylic acid or methacrylic acid, and the type of a monomer constituting the same is not particularly limited as long as it has non-photosensitive properties.

The second resist layer 120 may be a photosensitive resist layer. For example, the second resist layer 120 may include a photosensitive resin. The photosensitive resin may be, for example, a negative type, and the type of the resin is not particularly limited. For example, as long as the photosensitive resin is a negative-type resist capable of patterning by exposure and development by a photolithography process, a specific material constituting the same is not particularly limited.

Figure 2:
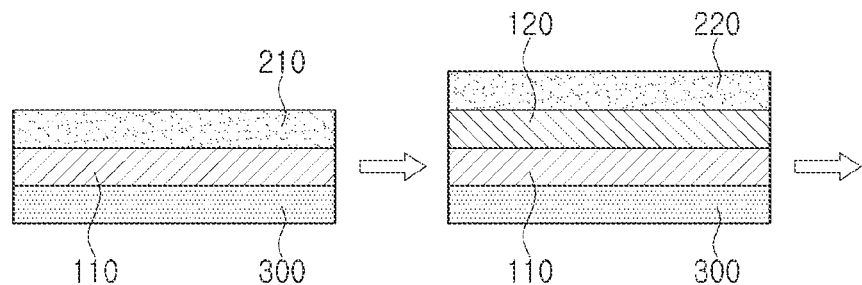
FIG. 2 schematically illustrates a process of manufacturing a resist laminate according to an example.
Figure 2:
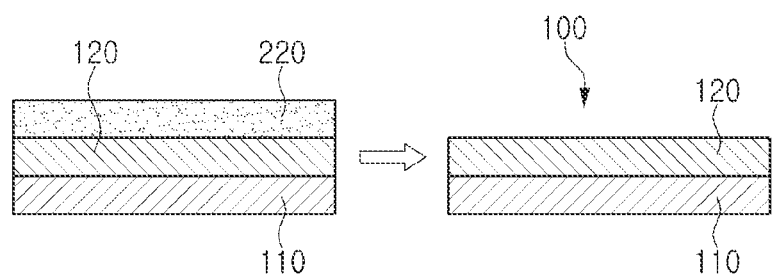

FIG. 2 schematically illustrates a process of manufacturing a resist laminate according to an example.

Referring to FIG. 2, the resist laminate 100 according to an example may be manufactured by laminating a first resist layer 110 on a cover film 300, using a first carrier film 210; after removing the first carrier film 210, by laminating a second resist layer 120 on the first resist layer 110, using a second carrier film 220; by removing the cover film 300; and by removing the second carrier film 220.

The type of the first and second carrier films 210 and 220 or the cover film 300 is not particularly limited, and may include various types of thermosetting resins and/or thermoplastic resins. For example, each of the first and second carrier films 210 and 220 and the cover film 300 may be a polyethylene terephthalate (PET) film, but is not limited thereto.

Figure 3:
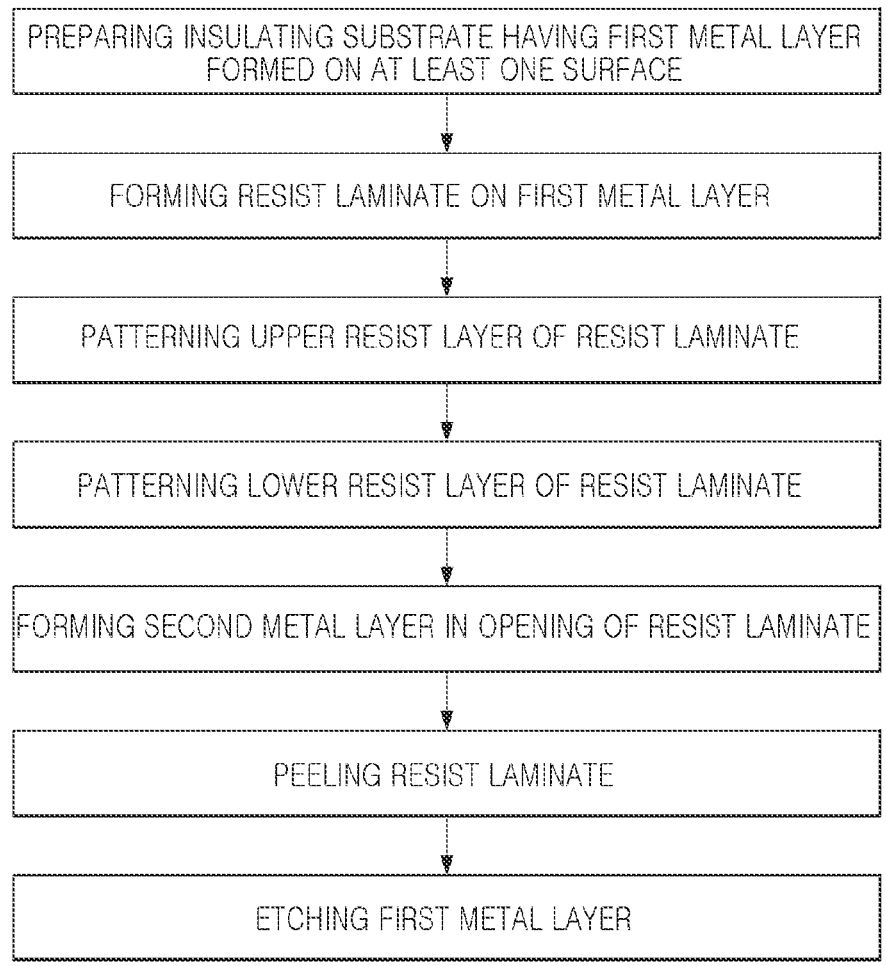
FIG. 3 schematically illustrates a process of manufacturing a printed circuit board according to an example.

FIG. 3 schematically illustrates a process of manufacturing a printed circuit board according to an example.

Referring to FIG. 3, a method of manufacturing a printed circuit board according to an example may include preparing an insulating substrate having a first metal layer formed on at least one surface of the insulating substrate, forming a resist laminate on the first metal layer, patterning an upper resist layer of the resist laminate, patterning a lower resist layer of the resist laminate, forming a second metal layer in an opening of the resist laminate, peeling the resist laminate, and etching the first metal layer.

As described above, in the method of manufacturing a printed circuit board according to an example, a resist laminate formed of a plurality of layers is first formed by multi-laminating, and then, the resist laminate having a plurality of layers is patterned by multi-patterning. As will be described later, a cross sectional width of an opening of the lower resist layer may be wider than a cross sectional width of an opening of the upper resist layer. Therefore, the lower foot of the resist may be reduced, and therefore, the undercut may be reduced in a circuit manufactured after etching, and the pattern delamination risk may also be reduced.

FIGS. 4 to 12 are cross-sectional views illustrating a step by step process of manufacturing the printed circuit board according to the example of FIG. 3.

Figure 4:
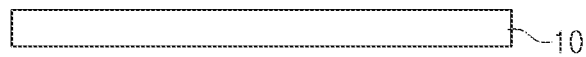
FIGS. 4 to 12 are cross-sectional views illustrating a process of manufacturing a printed circuit board according to the example of FIG. 3 in stages.

Referring to FIG. 4, an insulating substrate 10 is prepared. The insulating substrate 10 may be various types of insulating layers included in a printed circuit board. For example, the insulating substrate 10 may be a core layer of the printed circuit board, or may be an interlayer insulating layer of the printed circuit board. An insulating material may be used as the material of the insulating substrate 10, and as the insulating material, a thermosetting resin such as an epoxy resin or a thermoplastic resin such as polyimide, and a mixture of these resins with an inorganic filler such as silica and/or a reinforcing material such as glass fiber may be used. For example, as the material, Prepreg (PPG), a Copper Clad Laminate (CCL) insulating material, Ajinomoto Build-up Film (ABF), PhotoImageable Dielectric (PID), or the like may be used. In addition, the insulating substrate 10 may also include ceramic or the like. The insulating substrate 10 may be a rigid substrate and/or a flexible substrate depending on the material.

Figure 5:
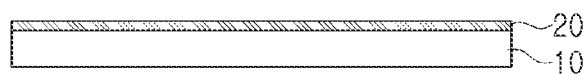

Referring to FIG. 5, a first metal layer 20 is formed on at least one surface of the insulating substrate 10. The first metal layer 20 may be a seed layer formed by electroless plating. A metal material may be used as the material of the seed layer, and as the metal material, copper (Cu), aluminum (Al), silver (Ag), tin (Sn), gold (Au), nickel (Ni), lead (Pb), titanium (Ti), or alloys thereof may be used. If necessary, the first metal layer 20 may further include a metal foil. The metal foil may be a copper foil or the like, and may be attached to at least one surface of the insulating substrate 10. The seed layer may be formed on this metal foil.

Figure 6:
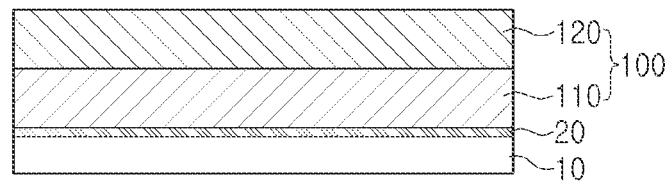

Referring to FIG. 6, the resist laminate 100 formed of a plurality of layers is laminated on the first metal layer 20. The resist laminate 100 of a plurality of layers may include a non-photosensitive first resist layer 110 and a photosensitive second resist layer 120 disposed on the first resist layer 110 as described above. The resist laminate 100 of the plurality of layers may be formed by multi-lamination as described above, and the prepared laminate may be laminated on the first metal layer 20. Alternatively, the above-described multi-lamination may be performed on the first metal layer 20. For example, the first resist layer 110 and the second resist layer 120 may be sequentially stacked on the first metal layer 20. The first resist layer 110 may be a non-photosensitive resist including an acrylic resin as described above, and the second resist layer 120 may be a negative photosensitive resist as described above, but is not limited thereto.

Figure 7:
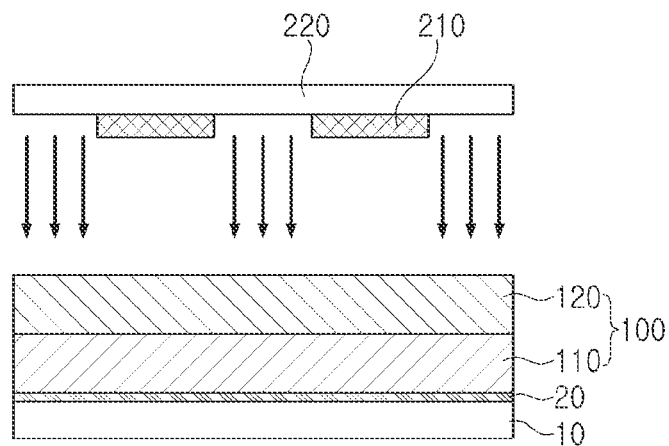

Referring to FIG. 7, the second resist layer 120 is exposed. For example, the second resist layer 120 may be exposed using an exposure apparatus 220 including a mask 210. For example, when the second resist layer 120 is a negative-type resist layer, the mask 210 may block a portion of the second resist layer 120 in which an opening is to be formed by patterning, and as a result, the portion of the second resist layer 120 blocked with the mask may be limited in exposure.

Figure 8:
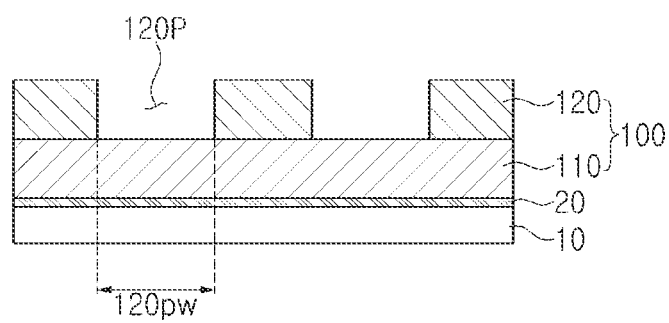

Referring to FIG. 8, the second resist layer 120 is developed. During the development process, a second opening 120P may be formed in a region in which exposure is limited due to the mask 210 described above. The second opening 120P may have a second width $120pw$ based on a cross-section. The second opening 120P may expose at least a portion of the first resist layer 110. As the developer, a solution containing sodium carbonate, tetramethylammonium hydroxide, or the like may be used, but this is only an example, and various types of developer may be used.

Figure 9:
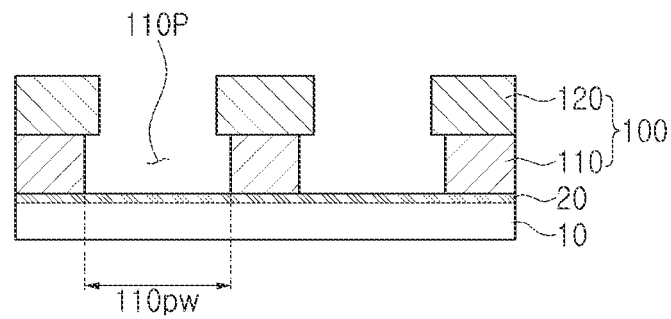

Referring to FIG. 9, the first resist layer 110 is developed. For example, the first resist layer 110 may be patterned by applying a developer to at least a portion of the first resist layer 110 exposed through the second opening 120P. The first resist layer 110 may be patterned with a developer without exposure. A first opening 110P may be formed during the development process. The first and second openings 110P and 120P may be connected to each other. By controlling the development time, the development area of the first resist layer 110 may be adjusted. For example, the first opening 110P may have a first width $110pw$ wider than the second width $120pw$ based on a cross-section. The first opening 110P may expose at least a portion of the first metal layer 20. As the developer, a solution containing sodium carbonate, tetramethylammonium hydroxide, or the like may be used, but this is only an example, and various types of developer may be used. As the developer of the first resist layer 110, the same developer as that of the second resist layer 120 may be used, or different types of developer may be used.

Figure 10:
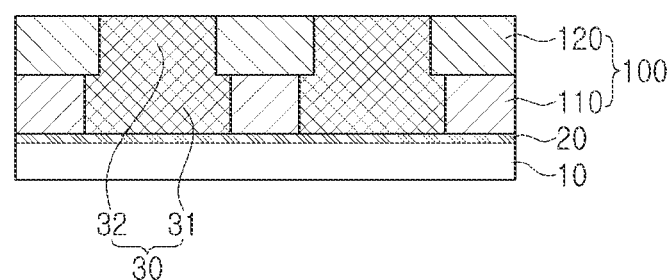

Referring to FIG. 10, a second metal layer 30 is formed on at least a portion of the first metal layer 20 exposed through the first and second openings 110P and 120P. The second metal layer 30 may be a plating layer formed by electrolytic plating. A metal material may be used as the material of the plating layer, and as the metal material, copper (Cu), aluminum (Al), silver (Ag), tin (Sn), gold (Au), nickel (Ni), lead (Pb), titanium (Ti), or alloys thereof may be used. The second metal layer 30 may include a lower first metal portion 31 filling the first opening 110P, and an upper second metal portion 32 filling the second opening 120P. Based on the cross-section, the width of the first metal portion 31 may be wider than the width of the second metal portion 32. Therefore, the risk of undercut or pattern delamination in the subsequent etching process or the like may be prevented.

Figure 11:
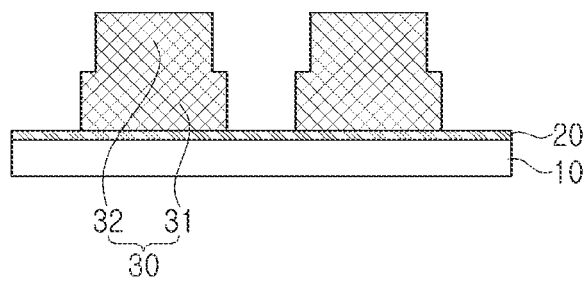

Referring to FIG. 11, the resist laminate 100 is removed. A stripping liquid may be used to remove the resist laminate. As the stripping liquid, an amine-based stripper and/or an alkali-based stripper may be used, but the stripping liquid is not limited thereto. Therefore, the first resist layer 110 and the second resist layer 120 may be peeled off simultaneously or may be peeled off sequentially. The strippers used for the first resist layer 110 and the second resist layer 120 may be the same or may be different kinds of strippers.

Figure 12:
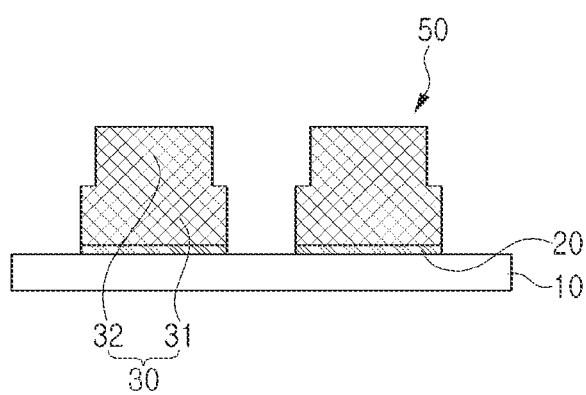

Referring to FIG. 12, at least another portion of the first metal layer 20 is etched. As the etching, flash etching or the like may be used. The first metal layer 20 exposed between the second metal layers 30 may be removed by etching. As a result, the circuit 50 including the patterned first and second metal layers 20 and 30 on the insulating substrate 10 may be formed. In this process, undercut or pattern delamination risk may hardly occur. The width of the lower portion of the circuit 50 may be wider than the width of the upper portion thereof, based on the cross-section.

A printed circuit board according to an example may be manufactured through the series of processes described above. The printed circuit board according to an example may be a single-layered substrate, or a multilayer substrate. The printed circuit board according to an example may be used as various types of printed circuit boards, such as a motherboard, an interposer board, and a package board. The printed circuit board according to an example may be easily used for signal connection in, for example, in a multi-chip package board, which requires the implementation of a highly integrated microcircuit.

As set forth above, according to an embodiment, a method of manufacturing a printed circuit board, in which undercut may be reduced, and a resist laminate used therefor may be provided.

In addition, a method of manufacturing a printed circuit board, in which pattern delamination may be reduced, and a resist laminate used therefor may be provided.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing a printed circuit board, the method comprising:
   preparing an insulating substrate on which a first metal layer is formed;
   stacking a resist laminate having a plurality of layers on the first metal layer;
   forming an opening exposing a portion of the first metal layer by patterning the stacked resist laminate having the plurality of layers;
   forming a second metal layer directly on the exposed portion of the first metal layer;
   removing the patterned resist laminate having the plurality of layers; and
   etching at least another portion of the first metal layer,
   wherein the resist laminate having the plurality of layers comprises a first resist layer of non-photosensitivity disposed directly on the first metal layer and a second resist layer of photosensitivity disposed on the first resist layer, and
   wherein the forming of the opening comprises:
   forming a second opening by exposing and developing, with a first development process, the second resist layer before the second metal layer is formed directly on the exposed portion of the first metal layer; and
   forming a first opening by developing, with a second development process after the first development process, the first resist layer, and
   wherein the forming of the second metal layer comprises filling the first and second openings with the second metal layer in a single step such that the second metal layer extends continuously from the first opening to the second opening.

2. The method of claim 1, wherein the forming of the opening is performed by sequentially patterning the stacked resist laminate having the plurality of layers.

3. The method of claim 1, wherein a width of a cross-section of the first opening is wider than a width of a cross-section of the second opening.

4. The method of claim 1, wherein the first resist layer of the non-photosensitivity comprises an acrylic resin.

5. The method of claim 1, wherein the second resist layer of the photosensitivity is a negative type.

6. The method of claim 1, wherein the first resist layer of the non-photosensitivity is disposed between the first metal layer and the second resist layer of the photosensitivity.

7. The method of claim 1, wherein the first metal layer comprises a seed layer formed by electroless plating.

8. The method of claim 7, wherein the first metal layer further comprises a copper foil, and
   the seed layer is formed on the copper foil.

9. The method of claim 1, wherein the second metal layer comprises a plating layer formed by electroplating.

10. The method of claim 1, wherein each of the first and second metal layers comprises copper (Cu).

11. The method of claim 1, wherein in the etching, a circuit is formed,
    wherein the circuit has a width of a lower cross-section wider than a width of an upper cross-section.

* * * * *